United States Patent
Conte

(10) Patent No.: US 6,647,357 B1
(45) Date of Patent: Nov. 11, 2003

(54) METHOD FOR CORRECTING RECIPROCITY ERROR IN TWO PORT NETWORK MEASUREMENTS

(75) Inventor: Robert A. Conte, Manalapan, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/499,208

(22) Filed: Feb. 7, 2000

(51) Int. Cl.[7] ............................ G06F 19/00; G01R 27/04
(52) U.S. Cl. ............................ 702/189; 702/85; 324/638
(58) Field of Search ............................ 702/189, 57, 65, 702/85, 104; 324/601, 638, 615, 625, 629, 637

(56) References Cited

U.S. PATENT DOCUMENTS

| | | | | |
|---|---|---|---|---|
| 5,784,299 A | * | 7/1998 | Evers et al. | 702/85 |
| 6,060,888 A | * | 5/2000 | Blackham et al. | 324/601 |
| 6,300,775 B1 | * | 10/2001 | Peach et al. | 324/601 |
| 6,396,285 B1 | * | 5/2002 | Blackham | 324/601 |
| 6,496,785 B1 | * | 12/2002 | Nakayama et al. | 702/117 |

\* cited by examiner

*Primary Examiner*—Patrick Assouad
(74) *Attorney, Agent, or Firm*—Birch, Stewart, Kolasch & Birch, LLP

(57) ABSTRACT

A method for correcting reciprocity error in two port network measurements, in which an iterative algorithm is used to obtain an optimal symmetric matrix approximation to a measured 2×2 reciprocal network. The algorithm smooths measured data to obtain a low noise floor on measurements related to mode conversion in cables and connecting hardware. A geometric interpretation is used to approximate a measured data vector with the closest vector which satisfies the reciprocity constraint. An initial point in the constraint surface (reciprocity manifold) is located, and another point which is a better approximation of the measured data vector which satisfies the reciprocity constraint is generated. By repeating this process, the closest point in the manifold is quickly located. This closest point defines a reciprocal matrix which can be used to estimate the actual device under test (DUT) parameters.

10 Claims, 4 Drawing Sheets

METHOD FOR CORRECTING RECIPROCITY ERROR IN TWO PORT NETWORK MEASUREMENTS

BACKGROUND OF THE INVENTION

1. Field of the Invention

The present invention generally relates to the measurement of network parameters with a multiport network analyzer and, more particularly, to a method for correcting reciprocity error in two port network measurements.

2. Description of the Related Art

In designing cables and connecting hardware for use with high frequency signals, it is imperative to understand the electrical characteristics of the components used to link a device or cable under-test with the electronics used to transmit and receive data. All of the possible couplings between connectors and cables can be measured with multiport measurement equipment comprising a network analyzer and a switching network. The key to providing an accurate multiport measurement system is a two port calibration procedure which is used repeatedly on every combination of pairs of ports in the measurement system.

Errors associated with network analyzer measurements can result from either non-ideal conditions in the measurement equipment or from the effects of the mechanical fixtures, such as cables and connectors, which are used to connect a device under test (DUT) to the network analyzer or test bed. A simple way to model this error is to view the test bed and the DUT as an ideal network analyzer cascaded with an error network and followed by the DUT. Such a network representation is illustrated in FIG. 1. The intervening network can then be used to account for the effects introduced by internal switching matrices connecting the various analyzer ports to the mechanical fixtures, as well as other sources of loss and distortion within the analyzer. The network can also be used to account for the effects of the fixtures themselves, which effects may introduce loss, crosstalk, and impedance discontinuities. Thus, the ideal network analyzer measures the cascaded network consisting of the intervening linear network followed by the DUT and obtains the measured S-parameters of the composite intervening network and DUT, here denoted as $S_M$. (See FIG. 1).

During testing, the acquired data which is intended to characterize the DUT is oftentimes corrupted by imperfections in the measuring device. The data must therefore be processed to compensate for known errors when extracting the parameters which describe the DUT, here denoted as $S_A$. An algorithm is used to relate the measured parameters $S_M$ to the actual parameters $S_A$. However, because the intervening network in the model is partially internal to the measurement equipment, $S_A$ cannot be evaluated separately. The only way to characterize $S_A$, therefore, is to measure various DUTs with known electrical characteristics and extract the appropriate parameters from $S_M$. This process is further complicated when switching networks are involved because each change in the switch settings of the network analyzer results in a change in the intervening network due to differences in the signal routing. Thus, a different intervening network exists for each switch setting of the Network Analyzer, and each network must therefore be separately evaluated to compensate for measurement errors.

In general, the characterization of a two port reciprocal network results in a symmetric 2×2 S-parameter matrix. Measurements of this network should therefore show this symmetry but they are often corrupted by noise, resulting in asymmetrical data. This error, which is denoted as reciprocity error, affects the calculations performed on measured data which are intended to correct measurement error. Specifically, the reciprocity error directly affects the noise floor of the calculation of the scattering between modes of propagation in cables and connecting hardware.

It would therefore be advantageous to provide a method for correcting the reciprocity error in measured data obtained during the characterization of a 2×2 S-parameter matrix.

SUMMARY OF THE INVENTION

The above and other problems are overcome by a method for correcting reciprocity error in two port network measurements which is used to produce a matrix with an optimal symmetric approximation of a measured 2×2 reciprocal network. According to the invention, an iterative technique is used to smooth the measured data to obtain a low noise floor on measurements related to mode conversion in cables and connecting hardware.

The calibration procedure for network analyzer measurements relates measured data to actual system parameters. These relationships, combined with the requirement for matrix symmetry, define the explicit form of a reciprocity manifold. The closest point on the manifold surface, occurring when a normal to the surface points directly to the measured data point, is used in defining a reciprocal matrix which can be used to estimate the actual device under test (DUT) parameters. In one embodiment, the closest point to the measured data is determined utilizing a successive approximation technique which includes estimating an initial point on a reciprocity manifold, approximating the manifold as a linear surface, and moving along the surface until the normal points directly at the measured data. The data is then projected onto the reciprocity manifold to produce the next iteration in the process.

The method of the invention supplements and extends a conventional two port calibration algorithm to properly compensate for the reciprocity constraint of passive networks such as cables and connecting hardware.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENT

Figure 1:
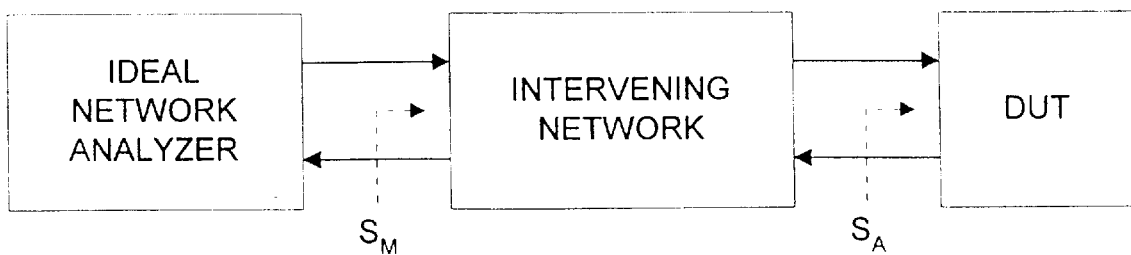
FIG. 1 is an illustration of a conventional error model for network analyzer measurements.

In making a 2 port measurement a number of calibration parameters and 4 raw measurements are needed to completely characterize a DUT. The information needed may be described as a multidimensional complex vector $\vec{v}$, and the actual S-parameter matrix $S_A$ (see FIG. 1) can be determined as $$S_A = \begin{bmatrix} s_{11} & s_{12} \\ s_{21} & s_{22} \end{bmatrix} = f(\vec{v}) \qquad \text{(Eq. 1)}$$

where $s_{11}$ is the input reflection parameter at port 1 of the network analyzer, $s_{12}$ is the reverse transmission parameter at port 2, $s_{21}$ is the forward transmission parameter at port 2 and $s_{22}$ is the output reflection parameter at port 2.

The function $f$ is defined by a method for a general intervening network, which is discussed in co-pending U.S. application Ser. No. 09/XXX,XXX, filed concurrently with this application (on XX, XX, 2000), and entitled "A Method for Calibrating Two Port High Frequency Measurements," the entire contents of which is incorporated by reference herein. Briefly, the method for a general intervening network can be used to determine scattering parameters in the presence of an arbitrary intervening network in the forward and reverse directions. Equating $s_{21}$ and $s_{12}$ yields the scalar constraint which is used to obtain matrix symmetry $$T(\vec{v}) = 0 \qquad \text{(Eq. 2)}$$

where $\vec{v}$ defines the vector which includes the measured data for the DUT as well as the calibration coefficients. At the moment that $T(\vec{v})$ is equal to zero, the matrix of Eq. 1 will be symmetric.

The occurrence of matrix symmetry may be obtained from a geometric interpretation whereby the region where $T(\vec{v})=0$ defines an n−1 dimensional complex surface in an n dimensional complex space. Within this constraint surface, defined herein as the reciprocity manifold, the closest point to the measured data vector defines the best symmetric matrix approximation. This point is located where the 'normal' to the manifold surface points directly at the measured data vector. Where $\vec{P}_0$ is the optimal point on the surface and $\vec{P}$ is the measured data point, the optimal condition can be represented as:

$$\vec{P}_0 - \vec{P} = \mu \nabla T(\vec{P}_0)^* \qquad \text{(Eq. 3)}$$

where $\mu$ is a scalar constant.

For a 12 term error model (illustrated in the network of FIG. 4), there are 12 calibration parameters and 4 raw data measurements, indicating that the dimension of $\vec{v}$ is 16. In this case, $$T(\vec{v}) = v_5 v_{10}(v_{15}-v_8)(v_{13}-v_1) - v_4 v_{11}$$
$$(v_{16}-v_7)(v_{14}-v_2) + (v_{15}-v_8)(v_1 v_{12}+v_3 v_{10}-v$$
$$12 v_{13}) + (v_{14}-v_2)(v_6 v_{16}-v_6 v_7 - v_4 v_9). \qquad \text{(Eq. 4)}$$

Figure 2:
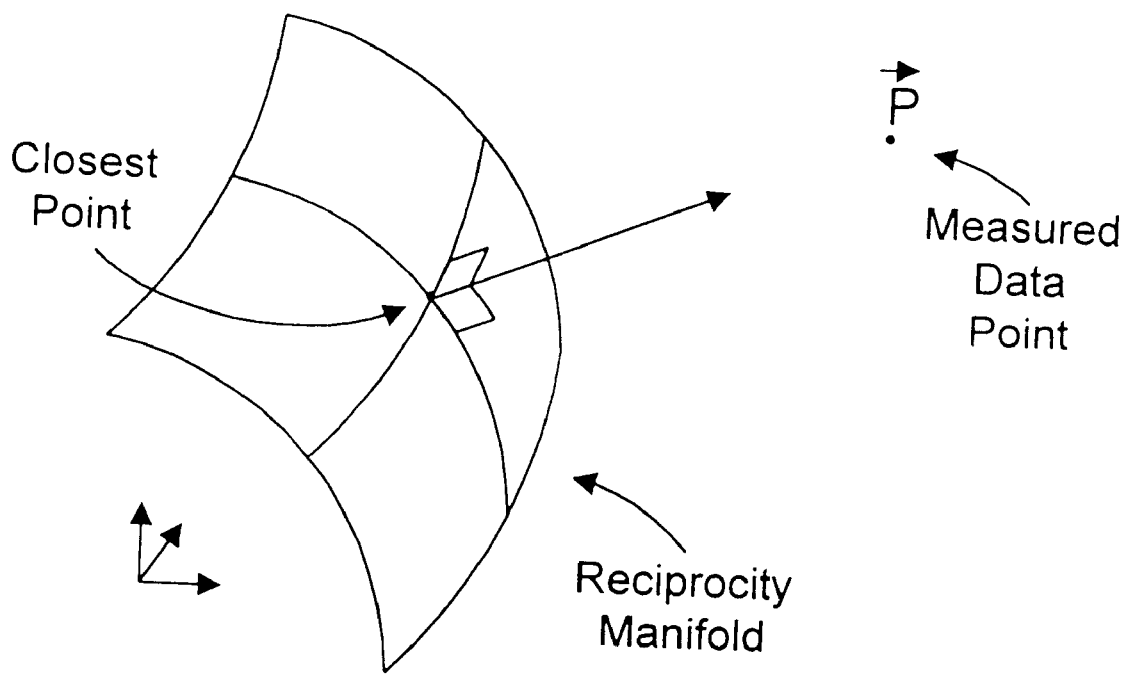
FIG. 2 is a graphical illustration of a reciprocity manifold.

FIG. 2 is an illustration of a reciprocity manifold, where a manifold is a surface in a vector space. The reciprocity manifold is a surface where any point within the manifold possesses the imposed reciprocity constraints. As shown in FIG. 2, the measured data point $\vec{P}$ will generally be on the surface defined by $T(\vec{P})=\epsilon$, where $\epsilon$ generally is small and represents the difference between the measured data point and the desired point on the reciprocity manifold due to the accuracy of the new "Algorithm for a General Intervening Network"

Figure 3:
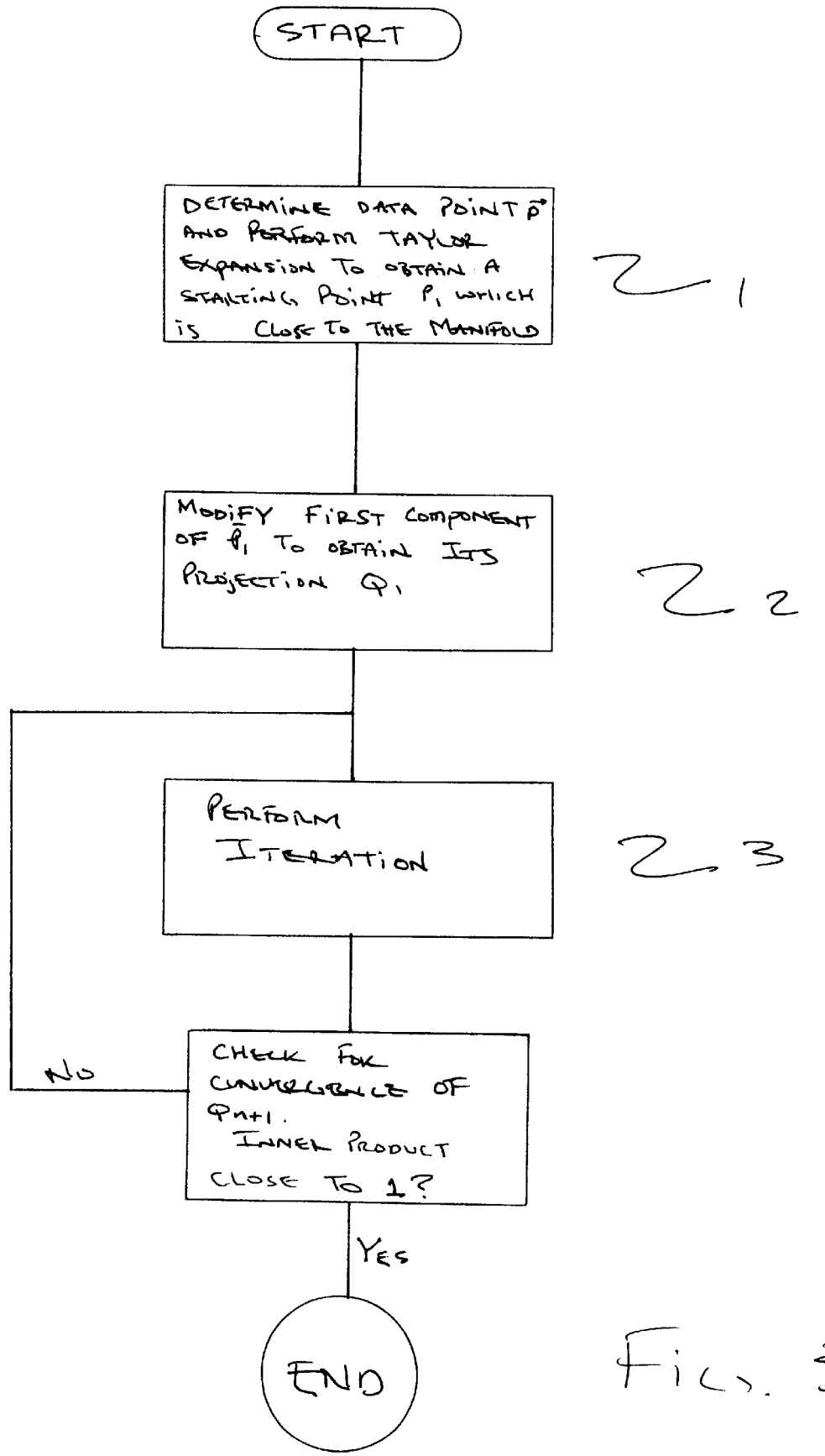
FIG. 3 is a flow chart of a method for correcting reciprocity error in two port network measurements.

FIG. 3 is a flow chart of the new method for correcting reciprocity error in two port network measurements. First, via a software program residing on a PC, data point $\vec{P}$ is determined by moving from the measured point in the direction of the normal to the surface $T(\vec{v})=\epsilon$ until the surface $T(\vec{v})=0$ is reached. (Step 1).

The point of intersection can be defined as:

$$T(\vec{P}+\lambda \nabla T(\vec{P})^*) = 0 \qquad \text{(Eq. 5)}$$

This expression can be evaluated via a Taylor expansion of $T(\vec{v})$ derived from Eq. 5 which provides that $$T(\vec{P}) + \lambda |\nabla T(\vec{P})|^2 \approx 0 \qquad \text{(Eq. 6)}$$

where $$\lambda \approx -\frac{T(\vec{P})}{|\nabla T(\vec{P})|^2} \qquad \text{(Eq. 7)}$$

$\vec{P}+\lambda \Delta T(\vec{P})^*$ in Eq. 5 represents a straight line from the measured data point $\vec{P}$ in the direction of the normal on the surface $T(\vec{P})=\epsilon$.

The starting point for the iteration is the projection of $\vec{P}_1$ onto the reciprocity manifold, where $\vec{P}_1$ is given by the relationship $$\vec{P}_1 \equiv \vec{P} - \frac{T(\vec{P})'}{|\nabla T(\vec{P})|^2} \nabla T(\vec{P}) \qquad \text{(Eq. 8)}$$

This equation can be obtained by substituting Eq. 6 for $\lambda$ in Eq. 5. This projection is achieved by modifying one of the components of $\vec{P}_1$ to force $T(\vec{P}_1)$ to be identically zero.

Figure 4:
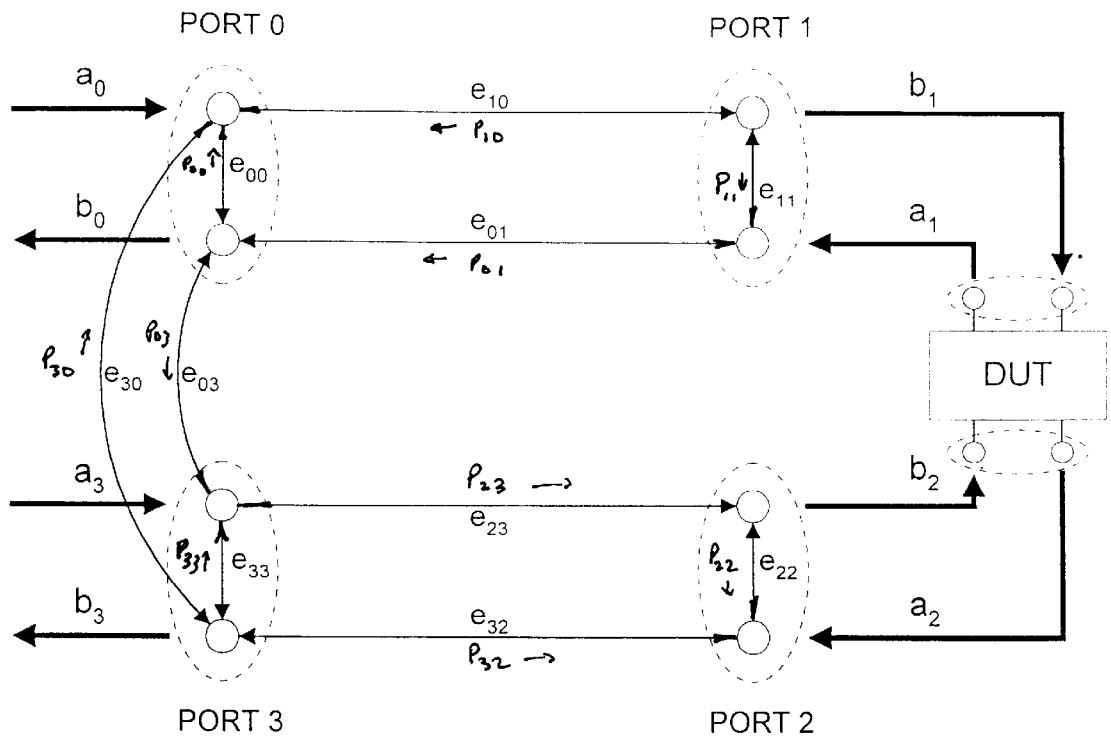
FIG. 4 is an illustration of a 12 term error model for two port measurements.

FIG. 4 is an illustration of a 12 term error model for two port network measurements wherein an error term is associated with each connection path in the network. Application of the method for the general intervening network to the network shown in FIG. 4 yields 12 unknown quantities from the intervening network and 4 uncalibrated measurements of the DUT. These 16 quantities completely define all of the information needed to compute the actual S-parameters of the DUT, and are expressed in vector form as:

$$v_s = \begin{bmatrix} e_{00} & e_{30} & e_{10}e_{01} & \dfrac{e_{01}}{e_{32}} & e_{11} & \dfrac{e_{01}e_{22}}{e_{32}} & p_{33} & p_{03} & p_{23}p_{32} & \dfrac{p_{32}}{p_{01}} & p_{22} & \dfrac{p_{11}p_{32}}{p_{01}} & sm_{11} & sm_{21} & sm_{12} & sm_{22} \end{bmatrix}, \qquad \text{(Eq. 9)}$$

where each e in Eq. 9 represents an appropriate component in a S-parameter characterization of the intervening network in the forward direction, each p represents the appropriate component in the S-parameter characterization of the intervening network in the reverse direction, and $sm_{11}$, $sm_{21}$, $sm_{12}$, and $sm_{22}$ are the measured input reflection at port 1 of the network analyzer, the measured forward transmission at port 2, the measured reverse transmission at port 2 and the measured output reflection at port 2, respectively.

For the 12 term error model, the projection is achieved by modifying the first component of $\vec{P}_1$ which is denoted as $v_1$, where $$v_1 = v_{13} + \frac{v_3 v_{10}}{v_5 v_{10} - v_{12}} + \frac{v_4 v_9 (v_{14} - v_2)}{(v_8 - v_{15})(v_5 v_{10} - v_{12})} + \frac{(v_{16} - v_7)(v_{14} - v_2)(v_4 v_{11} - v_6)}{(v_8 - v_{15})(v_5 v_{10} - v_{12})} \quad \text{(Eq. 10)}$$

and $v_1$ through $v_{12}$ represent the 12 calibration coefficients and $v_{13}$ through $v_{16}$ represent the four the raw data points $sm_{11}$, $sm_{12}$, $sm_{21}$, $sm_{22}$ of Eq. 9. This projection $\vec{Q}_1$ of $\vec{P}_1$ may be represented by the functional relationship $\vec{Q}_1 = \text{proj}(\vec{P}_1)$.

Next, given the $n^{th}$ iterant $\vec{Q}_n$ (where $\vec{Q}_1$ is the starting point), the next iterant $\vec{Q}_{n+1}$ is computed (step 2), according to the relationship $$\vec{P}_{n+1} = \vec{P} + (\vec{Q}_n - \vec{P}) \cdot \vec{u}(\vec{Q}_n) \vec{u}(\vec{Q}_n) \quad \text{(Eq. 11)}$$

where $$\vec{u}(\vec{Q}_n) \equiv \frac{\nabla T(\vec{Q}_n)^*}{|\nabla T(\vec{Q}_n)|}. \quad \text{(Eq. 12)}$$

These equations are derived by approximating $T(\vec{v})$ as a linear surface which passes through $\vec{Q}_n$. In Eq. 11, $\vec{P}_{n+1}$ is the point on the linear surface having a normal which points directly to $\vec{P}_1$. $\vec{P}_{n+1}$ is subsequently projected onto the reciprocity manifold. This is accomplished by modifying the first component of $\vec{P}_{n+1}$ in accordance with Eq. 9. As a result of the modification, the projected point becomes equal to $\vec{Q}_{n+1}$.

Subsequently, convergence is checked by examining the cosine of the angle between $\vec{Q}_n - \vec{P}$ and $\nabla T(\vec{Q}_n)^*$. (Step 3) This is achieved by computing the inner product of $$\frac{\vec{Q}_n - \vec{P}}{|\vec{Q}_n - \vec{P}|} \cdot \frac{\nabla T(\vec{Q}_n)^*}{|\nabla T(\vec{P}_n)^*|} \quad \text{(Eq. 13)}$$

If this quantity is sufficiently close to 1, the process is terminated. Otherwise, a return to step 2 occurs and the process is repeated. A value of 0.9999999999, for example, has been achieved in less than five iterations and provides acceptable results. However, the required closeness to 1 depends on the desired level of accuracy which is dependent to some extent on the frequency being evaluated.

S-parameter measurements of reciprocal networks using a network analyzer result in symmetric matrices. Errors associated with the network analyzer measurements can result from either non-ideal conditions in the measurement equipment, resulting in a non-symmetrical matrix. Using the method according to the invention, a best symmetric approximation is achieved via processing on a PC.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A method for correcting reciprocity error in two port network measurements, comprising the steps of:

estimating an initial data point on a reciprocity manifold;

performing an iteration to determine an optimal point on the manifold;

checking for matrix symmetry by determining whether a normal to the reciprocity manifold points to a measured data point; and performing subsequent iterations until matrix symmetry is achieved within a predetermined tolerance to correct reciprocity error in the two port network measurements.

2. The method of claim 1, wherein said performing step comprises:

approximating the reciprocity manifold as a linear surface;

determining a vector point within the linear surface having the normal which points to the measured data point; and projecting the initial data point onto the reciprocity manifold to compute a next iterant.

3. The method of claim 2, wherein said projection step comprises:

modifying a first component of the iterant until a modified vector of the iterant is on the reciprocity manifold.

4. The method of claim 1, wherein said checking step comprises:

measuring a cosine of an angle of a difference between an optimal point on a linear surface and the measured data point, and the normal to the reciprocity manifold at the optimal point.

5. The method of claim 1, wherein said checking step comprises:

evaluating an inner product of two vectors to determine whether the normal to the reciprocity manifold points to the measured data point;

evaluating whether the inner product is substantially close to one; and wherein the predetermined tolerance is the inner product being substantially equal to one.

6. The method of claim 1, wherein said estimating step comprises:

utilizing a Taylor expansion to estimate an initial starting point on the reciprocity manifold.

7. The method of claim 3, wherein said step of modifying is performed using the relationship $$v_1 = v_{13} + \frac{v_3 v_{10}}{v_5 v_{10} - v_{12}} + \frac{v_4 v_9 (v_{14} - v_2)}{(v_8 - v_{15})(v_5 v_{10} - v_{12})} + \frac{(v_{16} - v_7)(v_{14} - v_2)(v_4 v_{11} - v_6)}{(v_8 - v_{15})(v_5 v_{10} - v_{12})},$$

where $v_1$ through $v_{12}$ are calibration coefficients and $v_{13}$ through $v_{16}$ are raw data points.

8. The method of claim 4, wherein said evaluating step includes the step of evaluating $$\frac{\vec{Q}_n - \vec{P}}{|\vec{Q}_n - \vec{P}|} \cdot \frac{\nabla T(\vec{Q}_n)^*}{|\nabla T(\vec{P}_n)^*|},$$

where $\vec{Q}_n$ is an $n^{th}$ iterant, $\vec{P}$ is the measured data point, $\nabla T(\vec{Q}_n)^*$ is a normal to a surface at $\vec{Q}_n$ and $\nabla T(\vec{P}_n)^*$ is the normal to the surface at $\vec{P}_n$.

9. The method of claim 5, wherein said two vectors comprises the relationship $$\frac{\vec{Q}_n - \vec{P}}{|\vec{Q}_n - \vec{P}|} \cdot \frac{\nabla T(\vec{Q}_n)^*}{|\nabla T(\vec{P}_n)^*|},$$

where $\vec{Q}_n$ is an $n^{th}$ iterant, $\vec{P}$ is the measured data point, $\nabla T(\vec{Q}_n)^*$ is a normal to a surface at $Q_n$ and $\nabla T(\vec{P}_n)^*$ is the normal to the surface at $\vec{P}_n$.

10. A method for correcting reciprocity error in two port network analyzer measurements, comprising the steps of:
   measuring an initial data point using the analyzer;
   estimating a position of the data point on a reciprocity manifold;
   performing an iteration to determine an optimal point on the manifold;
   checking for matrix symmetry by determining whether a normal to the reciprocity manifold points to a measured data point;
   correcting reciprocity error within a matrix by performing subsequent iterations until matrix symmetry is achieved within a predetermined tolerance.

* * * * *